(12) United States Patent
Nam et al.

(10) Patent No.: US 6,169,694 B1
(45) Date of Patent: Jan. 2, 2001

(54) CIRCUIT AND METHOD FOR FULLY ON-CHIP WAFER LEVEL BURN-IN TEST

(75) Inventors: Young June Nam; Young Hee Kim, both of Kyoungki-do (KR)

(73) Assignee: Hyundai Electronics Industries Co., Kyoungki-do (KR)

( * ) Notice: Under 35 U.S.C. 154(b), the term of this patent shall be extended for 0 days.

(21) Appl. No.: 09/317,210

(22) Filed: May 24, 1999

(30) Foreign Application Priority Data

May 25, 1998 (KR) .................................................. 98-18886

(51) Int. Cl.$^7$ ........................................................ G11C 7/00
(52) U.S. Cl. .................... 365/201; 365/203; 365/189.11; 365/189.09
(58) Field of Search .................................. 365/201, 203, 365/189.11, 189.09; 371/21.1

(56) References Cited

U.S. PATENT DOCUMENTS

| | | | |
|---|---|---|---|
| 5,282,167 | * 1/1994 | Tanaka et al. | 365/201 X |
| 5,539,692 | 7/1996 | Kajigaya et al. | 365/189.01 |
| 5,557,573 | 9/1996 | McClure | 365/201 |
| 5,590,079 | 12/1996 | Lee et al. | 365/201 |
| 5,592,422 | 1/1997 | McClure | 365/201 |
| 5,619,462 | 4/1997 | McClure | 365/201 |
| 5,638,331 | 6/1997 | Cha et al. | 365/201 |
| 5,694,364 | * 12/1997 | Morishita et al. | 365/201 |
| 5,790,465 | 8/1998 | Roh et al. | 365/201 |
| 5,852,581 | 12/1998 | Beffa et al. | 365/201 |
| 5,926,423 | * 9/1999 | Jeong | 365/203 X |
| 5,953,271 | * 9/1999 | Ooishi | 365/201 |

* cited by examiner

*Primary Examiner*—Huan Hoang
(74) *Attorney, Agent, or Firm*—Nath & Associates PLLC; Gary M. Nath; Harold L. Novick

(57) ABSTRACT

A circuit and method for conducting a fully on-chip wafer level burn-in test, which are adapted to generate, in a chip, a stress screen voltage required for a wafer burn-in test, based on an externally supplied voltage and an external control signal, namely, a wafer burn-in signal, thereby being capable of conducting a wafer burn-in test. The circuit includes a high voltage generating unit for receiving an external power supply voltage and generating a high voltage for gate oxide film failure screening for a cell in response to the received external power supply voltage, a pad on-chip unit for detecting a wafer burn-in signal and generating a wafer burn-in test mode entry signal upon detecting the wafer burn-in signal, a bit line pre-charge voltage generating unit for generating a bit line pre-charge voltage for the gate oxide film failure screening for the cell in response to the wafer burn-in test mode entry signal output from the pad on-chip unit, and a cell plate voltage generating unit for generating a cell plate voltage for capacitor failure screening for the cell in response to the wafer burn-in test mode entry signal.

14 Claims, 5 Drawing Sheets

CIRCUIT AND METHOD FOR FULLY ON-CHIP WAFER LEVEL BURN-IN TEST

BACKGROUND OF THE INVENTION

1. Field of the Invention

The present invention relates to techniques for testing initial reliability of semiconductor devices, and more particularly, to a circuit and method for conducting a fully on-chip wafer level burn-in test which are adapted to generate, in a chip, a stress screen voltage required for a wafer burn-in test, based on an externally supplied voltage and an external control signal, namely, a wafer burn-in signal, thereby being capable of conducting a wafer burn-in test.

2. Description of the Related Art

For semiconductor devices such as DRAMs, a screening test is generally conducted in order to screen out those having poor quality prior to the practical use thereof. For such a screening test, a burn-in test is mainly used which is to test the reliability of DRAMs under the conditions of using an elevated temperature and an elevated voltage.

In such a burn-in test, DRAMs are operated under severe conditions involving an elevated temperature and an elevated voltage so that they exhibit potential failures thereof within a reduced period of time.

To this end, desired parts of a chip should be appropriately stressed, that is, subjected to accelerated stress. In the case of a DRAM using an internal power supply voltage, such a burn-in test is also required. In this case, however, an internal power supply circuit included in such a DRAM should control its internal power supply voltage during a burn-in test in order to prevent the internal circuit of the DRAM from being over-stressed. In other words, the internal power supply circuit should operate to apply stress for only screening to the internal circuit of the DRAM.

A burn-in test may be conducted by varying an external clock signal to be applied to a DRAM to be tested by the user to inform a burn-in test mode of the DRAM, thereby controlling the DRAM to operate in the burn-in test mode. However, a more convenient method is to simply increase an external voltage, to be applied to the DRAM, to a desired level or higher, thereby automatically switching the operation mode of the DRAM to the burn-in test mode.

Meanwhile, for such a burn-in test, the internal power supply voltage, $V_{INT}$, and external application voltage, $V_{EXT}$, should meet the following conditions:

1) The entire circuit should exhibit a constant voltage increase ratio.

That is, it is necessary to increase the voltages $V_{INT}$ and $V_{EXT}$, which are applied to circuits on the chip in a normal operation mode at a constant ratio for the entire circuit in a burn-in test mode.

In this regard, the circuits using the external application voltage VEXT and the circuits using the internal power supply voltage VINT should exhibit the same voltage increase ratio in the burn-in test mode, that is, they should use burn-in test voltages increased from those in the normal operation mode by the same voltage increase ratio, respectively.

This condition may be expressed by the following equation:

$$\frac{V_{INTB}}{V_{INTN}} = \frac{V_{EXTB}}{V_{EXTN}} = k_1 = k_2$$

2) An appropriate static voltage range should be ensured in a normal operation mode.

That is, since DRAMs are configured to operate normally even in the case of a variation in an external rated voltage, the internal power supply voltage should be constant within the external rated voltage range.

This condition may be expressed by the following equation:

$$V_{INT} = V_{INTN} \ (0.9 \ V_{EXTN} \leq V_{EXT} \leq 1.1 \ V_{EXTN})$$

In conventional semiconductor devices, a stress screen voltage from the outside should be applied to a die in order to screen failures of initial reliability occurring after a burn-in test.

Where an excessively high external voltage is applied to the die, failures may occur due to such an unstable external voltage. Such failures may result in a failure of the burn-in test.

As a result, there is a waste of time and costs consumed to prepare other wafers for a burn-in test.

SUMMARY OF THE INVENTION

Therefore, the present invention has been made in view of the above-mentioned problems, and an object of the invention is to provide a circuit and a method for conducting a fully on-chip wafer level burn-in test which are adapted to generate, in a chip, a stress screen voltage required for a wafer burn-in test, based on an externally supplied voltage and an external control signal, namely a wafer burn-in signal, thereby being capable of conducting a wafer burn-in test.

In accordance with one aspect, the present invention provides a circuit for conducting a fully on-chip wafer level burn-in test for a chip, comprising: a high voltage generating unit for receiving an external power supply voltage and generating a high voltage for gate oxide film failure screening for a cell in response to the received external power supply voltage; a pad on-chip unit for detecting a wafer burn-in signal and generating a wafer burn-in test mode entry signal upon detecting the wafer burn-in signal; a bit line pre-charge voltage generating unit for generating a bit line pre-charge voltage for the gate oxide film failure screening for the cell in response to the wafer burn-in test mode entry signal output from the pad on-chip unit; and a cell plate voltage generating unit for generating a cell plate voltage for capacitor failure screening for the cell in response to the wafer burn-in test mode entry signal.

In accordance with another aspect, the present invention provides a method for conducting a fully on-chip wafer level burn-in test for a chip, comprising the steps of: (a) receiving an external power supply voltage and generating a high voltage for gate oxide film failure screening for a cell in response to the received external power supply voltage; (b) detecting a wafer burn-in signal and generating a wafer burn-in test mode entry signal upon detecting the wafer burn-in signal; (c) generating a bit line pre-charge voltage for the gate oxide film failure screening for the cell in response to the wafer burn-in test mode entry signal; and (d) generating a cell plate voltage for capacitor failure screening for the cell in response to the wafer burn-in test mode entry signal.

BRIEF DESCRIPTION OF THE DRAWINGS

Other objects and aspects of the invention will become apparent from the following description of embodiments with reference to the accompanying drawings in which.

DESCRIPTION OF THE PREFERRED EMBODIMENTS

The present invention is adapted to screen reliability failures of semiconductor devices occurring after a burn-in test which may be one of various tests for those semiconductor devices testing for failures of gate oxide films and failures of capacitors in particular. In accordance with the present invention, a fully on-chip test can be achieved which reduces the time and costs consumed to process various tests for semiconductor devices. The present invention can be applied to any IC device using transistors comprised of semiconductor devices such as DRAMs or SRAMs and capacitors for data storage.

Figure 1:
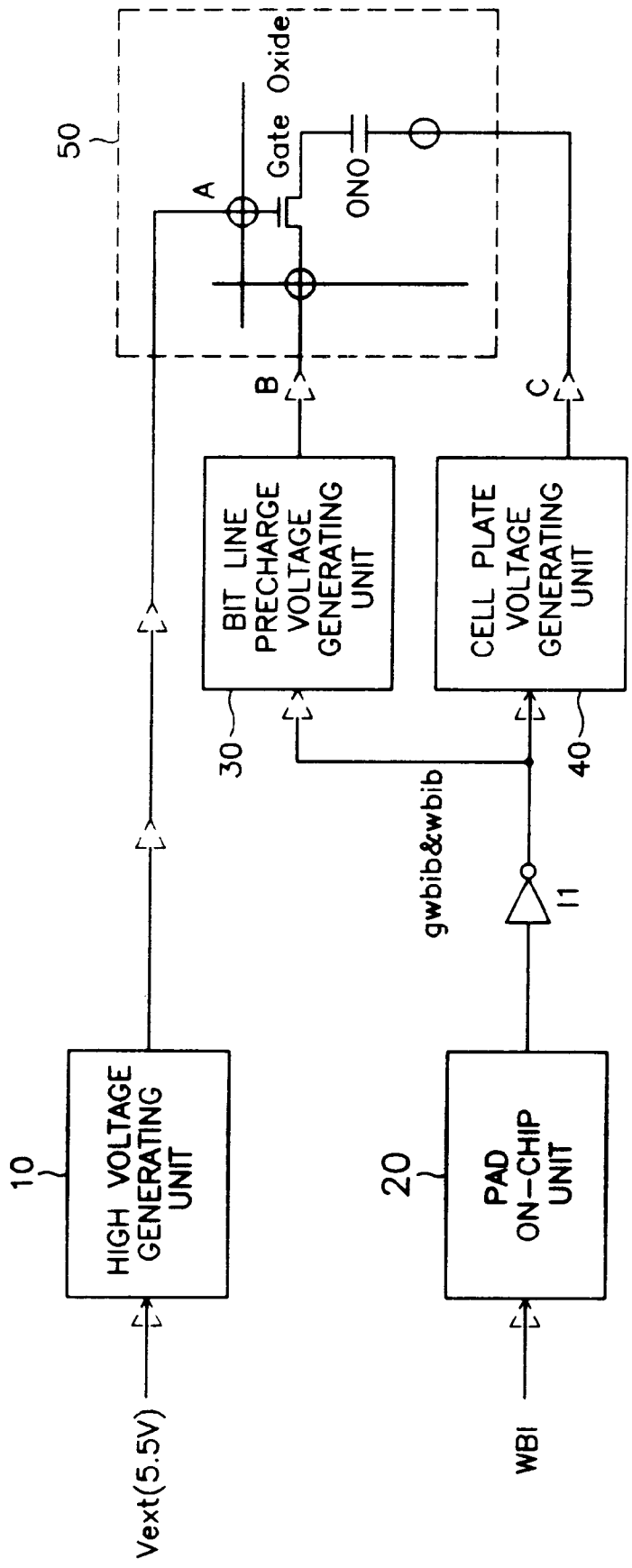
FIG. 1 is a block diagram illustrating a circuit for conducting a fully on-chip wafer level burn-in test according to the present invention.

Referring to FIG. 1, a circuit for conducting a fully on-chip wafer level burn-in test according to the present invention is illustrated.

As shown in FIG. 1, the testing circuit of the present invention includes a high voltage generating unit 10 for receiving an external power supply voltage Vext and generating a high voltage Vpp for gate oxide film failure screening for a cell 50 in response to the received external power supply voltage Vext, a pad on-chip unit 20 for detecting a wafer burn-in signal WBI and generating a wafer burn-in test mode entry signal upon detecting the wafer burn-in signal WBI, and a bit line pre-charge voltage generating unit 30 for generating a bit line pre-charge voltage Vblp adapted to gate oxide film failure screening for the cell 50 in response to the wafer burn-in test mode entry signal output from the pad on-chip unit 20. The testing circuit also includes a cell plate voltage generating unit 40 for generating a cell plate voltage Vcp for capacitor failure screening for the cell 50 in response to the wafer burn-in test mode entry signal.

The operation of the testing circuit having the above-mentioned configuration will now be described in conjunction with FIGS. 2 to 5 illustrating respective configurations of the units included in the testing circuit.

Figure 2:
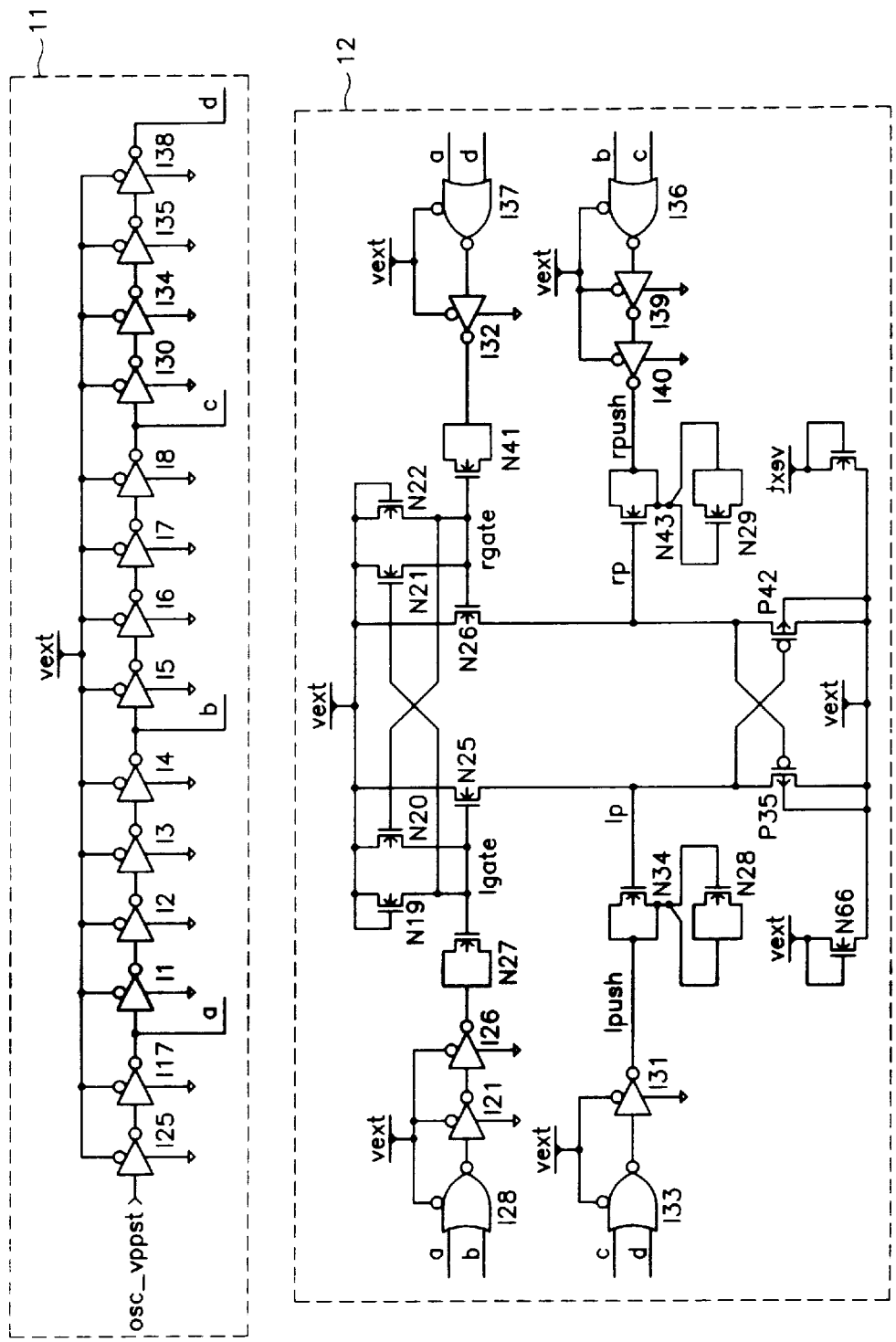
FIG. 2 is a circuit diagram illustrating a detailed circuit configuration of a high voltage generating unit shown in FIG. 1.

Referring to FIG. 2, a detailed configuration of the high voltage generating unit 10, which is adapted to generate a high voltage Vpp for gate oxide film failure screening in response to an external test operating voltage Vext, is illustrated. In the high voltage generating unit 10, four oscillation signals a, b, c, and d are generated from a ring oscillator 11 consisting of a plurality of inverters coupled together in series when an external test operating voltage Vext of, for example, 5.5 V is applied to the high voltage generating unit 10, as shown in FIG. 1. These oscillation signals a, b, c, and d are then applied to NOR gates I28 and I33 included in a phase shifter 12. The oscillation signals a, b, c, and d are also supplied to NAND gates I36 and I37 included in the phase shifter 12.

After being phase-shifted by the phase shifter 12, the oscillation signals a, b, c, and d serve to turn on NMOS transistors coupled to a voltage supply source for supplying a high voltage Vpp of, for example, 6.3 V. Accordingly, the high voltage generating unit 10 generates the high voltage Vpp which is, in turn, applied to a gate oxide film of the cell 50 as a stress voltage of 6.3 V.

Meanwhile, the bit line pre-charge voltage generating unit 30 and cell plate voltage generating unit 40 do not conduct their normal operations when the external wafer burn-in signal WBI has a high logic level corresponding to an enable state thereof. In this state, the bit line pre-charge voltage Vblp output from the bit line pre-charge voltage generating unit 30 and the cell plate voltage Vcp output from the cell plate voltage generating unit 40 cannot have a voltage level of Vcc/2 corresponding to that of the normal operation mode, but have a ground level.

Figure 3:
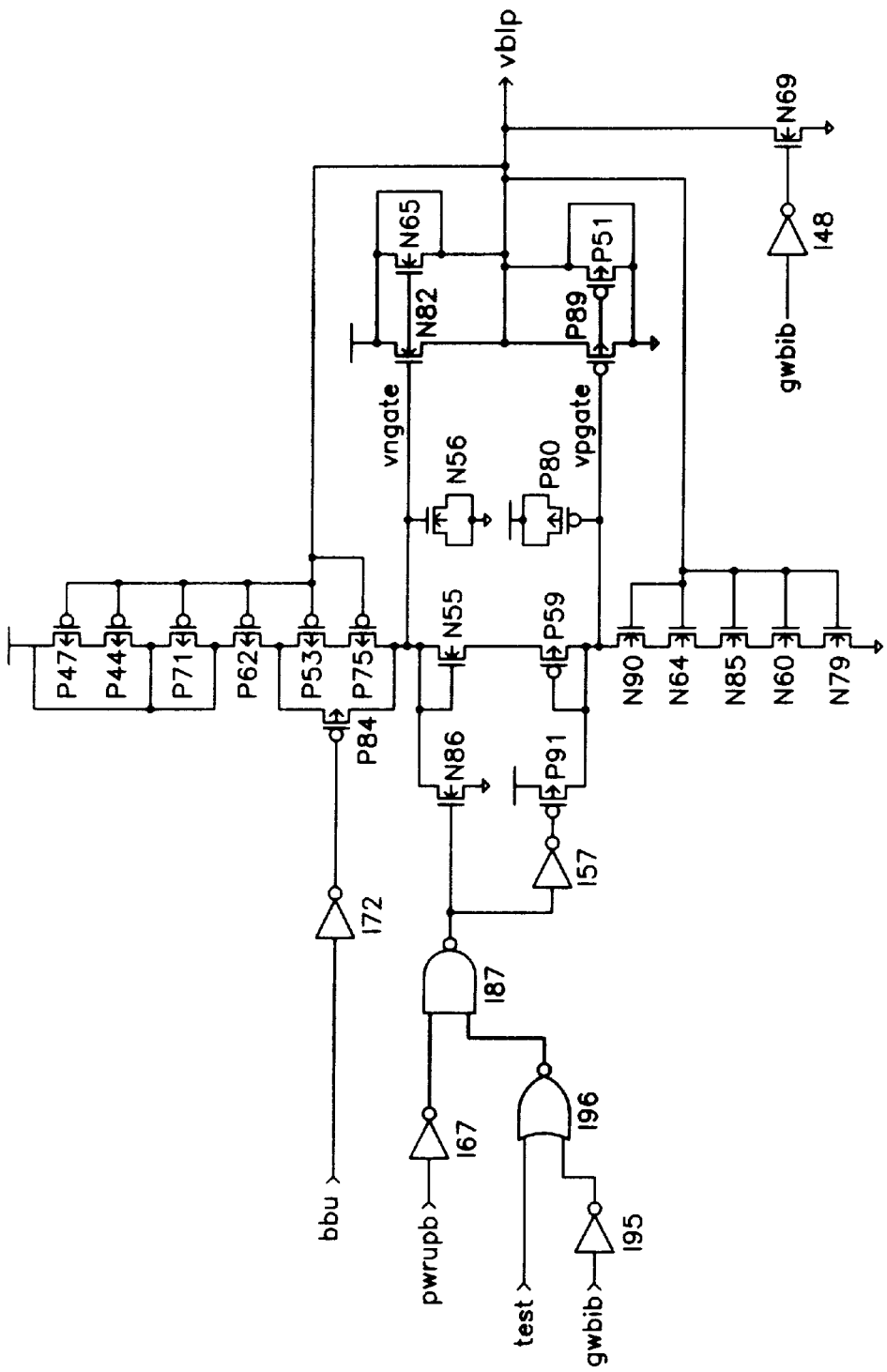
FIG. 3 is a circuit diagram illustrating a detailed circuit configuration of a bit line pre-charge voltage generating unit shown in FIG. 1.

Now, the operation of the bit line pre-charge voltage generating unit 30 will be described in detail, in conjunction with FIG. 3.

A signal gwbib, which is input to the bit line pre-charge voltage generating unit 30, has a low logic level when the wafer burn-in signal WBI has a high logic level corresponding to an enable state thereof. In a wafer burn-in test mode, the signal gwbib, which has a low logic level, is first inverted to a high logic level by an inverter I95, as shown in FIG. 3. The inverted signal is then applied to one input of a NOR gate I96. The NOR gate I96 conducts a NORing operation to output a high logic level signal only when both inputs thereof have a low logic level. Accordingly, the NOR gate I96 outputs a low logic level signal in response to the high logic level signal from the inverter I95.

The low logic level signal from the NOR gate I96 is then applied to one input of a NAND gate I87. The NAND gate I87 conducts a NANDing operation to output a low logic level signal only when both inputs thereof have a high logic level. Accordingly, the NAND gate I87 outputs a high logic level signal in response to the low logic level signal from the NOR gate I96.

The high logic level signal from the NAND gate I87 is applied to the gate of an NMOS transistor N86 and the gate of a PMOS transistor P91, thereby causing those transistors N86 and P91 to turn on.

In the turn-on states of the NMOS transistor N86 and PMOS transistor P91, an NMOS transistor N82 and a PMOS transistor P89 turn on, respectively. As a result, the bit line pre-charge voltage Vblp output from the bit line pre-charge voltage generating unit 30 cannot have a voltage level of Vcc/2 corresponding to that of the normal operation mode, but has a ground level.

The operation of the cell plate voltage generating unit 40 will be described in detail, in conjunction with FIG. 4.

In the wafer burn-in test mode, the signal gwbib, which has a low logic level, is input to the cell plate voltage generating unit 40.

Figure 4:
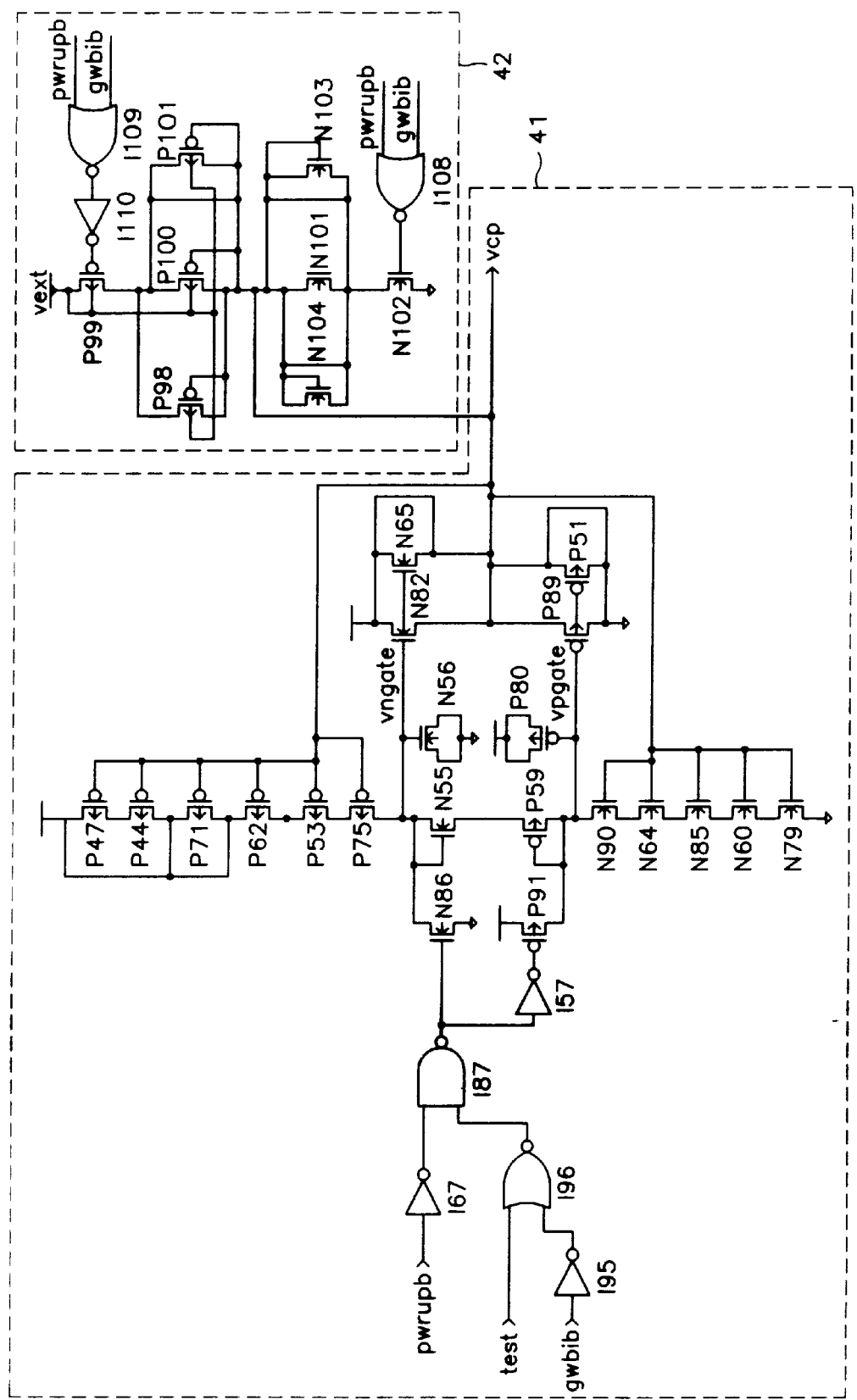
FIG. 4 is a circuit diagram illustrating a detailed circuit configuration of a cell plate voltage generating unit shown in FIG. 1.
Figure 5:
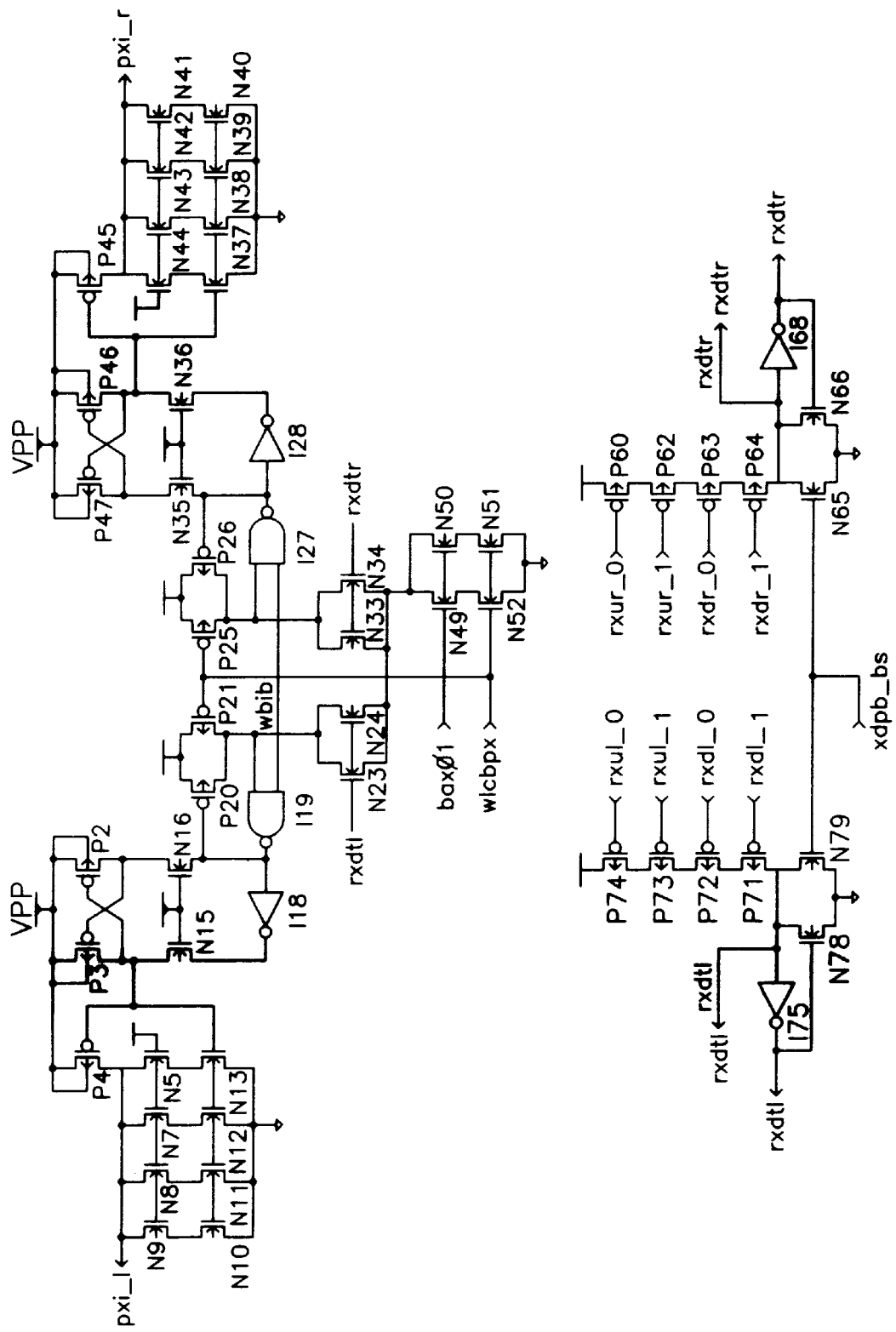
FIG. 5 is a circuit diagram illustrating a detailed circuit configuration of a word line decoder shown in FIG. 1.

The input signal gwbib is first inverted to a high logic level by an inverter I97 included in a cell plate voltage level generator 41, as shown in FIG. 4. The inverted signal is then applied to one input of a NOR gate I96. The NOR gate I96 conducts a NORing operation to output a high logic level signal only when both inputs thereof have a low logic level. Accordingly, the NOR gate I96 outputs a low logic level signal in response to the high logic level signal from the inverter I97.

The low logic level signal from the NOR gate I96 is then applied to one input of a NAND gate I87. The NAND gate I87 conducts a NANDing operation to output a low logic level signal only when both inputs thereof have a high logic level. Accordingly, the NAND gate I87 outputs a high logic level signal in response to the low logic level signal from the NOR gate I96.

The high logic level signal from the NAND gate I87 is applied to the gate of an NMOS transistor N86 and the gate of a PMOS transistor P91, thereby causing those transistors N86 and P91 to turn on.

In the turn-on states of the NMOS transistor N86 and PMOS transistor P91, an NMOS transistor N82 and a PMOS transistor P89 turn on, respectively. As a result, the bit line pre-charge voltage Vcp output from the bit line pre-charge voltage generating unit 30 cannot have a voltage level of Vcc/2 corresponding to that of the normal operation mode.

A wafer burn-in test signal wbt, which has a pulse width corresponding to a high polarity, is applied to an NMOS transistor N106 after a certain delay time determined by inverters's elapses from the point of time when the wafer burn-in signal WBI is enabled to have a high logic level, thereby causing the NMOS transistor N106 to turn on for a moment. In the ON state, the NMOS transistor N106 initializes the cell plate voltage Vcp of the cell plate voltage level generator 41 so that the cell plate voltage Vcp has a ground level. After completing this initialization, the NMOS transistor N106 turns off. Thus, the cell plate and ground are prevented from being short-circuited.

In this state, the external test operating voltage Vext of 5.5 V is applied to the cell plate voltage generating unit 40. In response to the external test operating voltage Vext, a voltage divider 42, which is coupled to the cell plate voltage level generator 41, generates a stress voltage for capacitor failure screening. This stress voltage is 2.9 V.

In place of the internal cell plate voltage Vcp, the voltage of 2.9 V is applied to the cell plate as an external power supply voltage Vext. Accordingly, it is possible to screen a failure of the capacitor ONO (Oxide-Nitride-Oxide) of the cell 50.

In accordance with the above-mentioned configuration, it is possible to forcibly enable a word line decoder (FIG. 5) which is adapted to enable a word line in response to the external wafer burn-in signal WBI enabled to have a high logic level. Accordingly, it is possible for all cells in the die to be accessed. Thus, the test time is greatly reduced.

As apparent from the above description, in accordance with the present invention, it is possible to reduce defects occurring in the die due to an excessive external test operating voltage in a wafer burn-in test. Since the test conditions are stable in accordance with the present invention, there is an advantage in confirming burn-in test result data.

In this regard, it is possible to not only reduce the test time needed for the sorting of other dies required to confirm burn-in test result data, but also to reduce the number of wafer-out processing steps for the preparation of samples. Therefore, a reduction in the costs and test time is achieved.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A circuit for conducting a fully on-chip wafer level burn-in test for a chip, comprising:

a high voltage generating unit for receiving an external power supply voltage and generating a high voltage for gate oxide film failure screening for a cell in response to said received external power supply voltage;

a pad on-chip unit for detecting a wafer burn-in signal and generating a wafer burn-in test mode entry signal upon detecting said wafer burn-in signal;

a bit line pre-charge voltage generating unit for generating a bit line pre-charge voltage for said gate oxide film failure screening for said cell in response to said wafer burn-in test mode entry signal output from said pad on-chip unit; and a cell plate voltage generating unit for generating a cell plate voltage for capacitor failure screening for said cell in response to said wafer burn-in test mode entry signal.

2. The circuit as claimed in claim 1, wherein said pad on-chip unit comprises a detecting circuit internally included in said chip, said detecting circuit serving to detect said wafer burn-in signal, thereby generating said wafer burn-in test mode entry signal.

3. The circuit as claimed in claim 1, wherein said cell plate voltage generating unit comprises:

a cell plate voltage level generator for initializing said cell plate voltage in response to said wafer burn-in signal in such a fashion that said cell plate voltage has a ground voltage level; and a voltage divider for receiving said external power supply voltage as an external test operating voltage when said cell plate voltage level generator initializes said cell plate voltage, and generating a stress voltage for said capacitor failure screening in response to said external test operating voltage.

4. The circuit as claimed in claim 3, wherein said voltage divider comprises a combination of transistors other than CMOS transistors.

5. The circuit as claimed in claim 3, wherein said voltage divider comprises a combination of CMOS transistors and registers.

6. The circuit as claimed in claim 3, wherein said voltage divider comprises a combination of registers and transistors other than CMOS transistors.

7. The circuit as claimed in claim 3, wherein said voltage divider comprises a combination of CMOS transistors and transistors other than CMOS transistors, said CMOS transistors and said transistors being coupled together in series.

8. A method for conducting a fully on-chip wafer level burn-in test for a chip, comprising the steps of:

(a) receiving an external power supply voltage, and generating a high voltage for gate oxide film failure screening for a cell in response to said received external power supply voltage;

(b) detecting a wafer burn-in signal, and generating a wafer burn-in test mode entry signal upon detecting said wafer burn-in signal;

(c) generating a bit line pre-charge voltage for said gate oxide film failure screening for said cell in response to said wafer burn-in test mode entry signal; and (d) generating a cell plate voltage for capacitor failure screening for said cell in response to said wafer burn-in test mode entry signal.

9. The method as claimed in claim 8, wherein said wafer burn-in test mode entry signal is generated at said step (b), based on a signal previously used in said chip.

10. The method as claimed in claim 8, wherein said wafer burn-in test mode entry signal is generated at said step (b), based on a read/write control signal for said chip.

11. The method as claimed in claim 8, wherein said wafer burn-in test mode entry signal is generated at said step (b), based on a data signal.

12. The method as claimed in claim 8, wherein said wafer burn-in test mode entry signal is generated at said step (b), based on an address signal.

13. The method as claimed in claim 8, wherein said wafer burn-in test mode entry signal is generated at said step (b) in accordance with a particular voltage level control.

14. The method as claimed in claim 8, wherein said cell plate voltage, as a stress voltage for capacitor failure screening, is internally generated in said chip at said step (d).

* * * * *